(12) United States Patent
Yamazaki et al.

(10) Patent No.: US 7,333,072 B2
(45) Date of Patent: Feb. 19, 2008

(54) THIN FILM INTEGRATED CIRCUIT DEVICE

(75) Inventors: Shunpei Yamazaki, Tokyo (JP); Yuko Tachimura, Kanagawa (JP); Yasuko Watanabe, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 744 days.

(21) Appl. No.: 10/801,135

(22) Filed: Mar. 16, 2004

(65) Prior Publication Data

US 2004/0245525 A1  Dec. 9, 2004

(30) Foreign Application Priority Data

Mar. 24, 2003  (JP) .............................. 2003-081544

(51) Int. Cl.
*G09G 5/00* (2006.01)
(52) U.S. Cl. .............................. 345/5; 345/4; 345/1.1; 345/2.2
(58) Field of Classification Search ............... 345/5, 345/4, 1.1, 2.2
See application file for complete search history.

(56) References Cited

U.S. PATENT DOCUMENTS

| | | | | |
|---|---|---|---|---|
| 4,521,775 | A | * | 6/1985 | Noble ............................ 345/4 |
| 5,300,735 | A | * | 4/1994 | Yokono et al. ............... 174/264 |
| 6,953,735 | B2 | | 10/2005 | Yamazaki |
| 7,045,955 | B2 | | 5/2006 | Seo |
| 7,056,810 | B2 | | 6/2006 | Yamazaki |
| 7,199,520 | B2 | | 4/2007 | Fujii |
| 7,211,461 | B2 | | 5/2007 | Sakata |
| 7,239,081 | B2 | | 7/2007 | Tsutsui |
| 2002/0034930 | A1 | | 3/2002 | Yamazaki |
| 2002/0063518 | A1 | | 5/2002 | Okamoto |
| 2003/0127967 | A1 | | 7/2003 | Tsutsui |
| 2003/0162314 | A1 | | 8/2003 | Yamazaki |

(Continued)

FOREIGN PATENT DOCUMENTS

JP  60198861 A  * 10/1985

(Continued)

OTHER PUBLICATIONS

Exhibition of Active Matrix Type Organic EL Display at "13th Flat Panel Display Manufacturing Technology Expo & Conference" by ELDis Group (*in Japanese with full translation*); Jul. 2, 2003.

(Continued)

*Primary Examiner*—Richard Hjerpe
*Assistant Examiner*—Leonid Shapiro
(74) *Attorney, Agent, or Firm*—Fish & Richardson P.C.

(57) ABSTRACT

A device having an integrated circuit, especially an IC card, for reliably verifying a person's identity by display of PIN numbers or passwords with ingenuity. Portable electronic devices such as a PDA or a cellular phone, or other products can have plural displays in a display area (display part) provided in a limited area. A first display area and a second display area having transparency are stacked together in a thin film integrated circuit device of the present invention. The area of display can be reduced and display of more complicated PIN numbers or passwords is enabled by layering the display of the first display area and the display of the second display area.

50 Claims, 11 Drawing Sheets

U.S. PATENT DOCUMENTS

| | | |
|---|---|---|
| 2003/0170491 A1 | 9/2003 | Liao |
| 2003/0189401 A1 | 10/2003 | Kido |
| 2004/0027059 A1 | 2/2004 | Tsutsui |
| 2004/0040504 A1 | 3/2004 | Yamazaki |
| 2004/0123804 A1 | 7/2004 | Yamazaki |
| 2004/0128246 A1 | 7/2004 | Takayama |
| 2004/0139914 A1 | 7/2004 | Yamazaki |
| 2004/0238827 A1 | 12/2004 | Takayama |
| 2005/0016462 A1 | 1/2005 | Yamazaki |
| 2005/0024339 A1 | 2/2005 | Yamazaki |
| 2005/0030404 A1* | 2/2005 | Takahashi et al. ..... 348/333.01 |
| 2005/0040753 A1 | 2/2005 | Osame |

FOREIGN PATENT DOCUMENTS

| | | | |
|---|---|---|---|
| JP | 3408154 | | 12/1998 |
| JP | 2000-215295 | | 8/2000 |
| JP | 2001068678 A | * | 3/2001 |
| JP | 2002-258975 | | 9/2002 |

OTHER PUBLICATIONS

Documents distributed in the "13th Flat Panel Display Manufacturing Technology Expo & Conference" by ELDis Group (5 pages).

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

* cited by examiner a.

b.

THIN FILM INTEGRATED CIRCUIT DEVICE

BACKGROUND OF THE INVENTION

1. Field of the Invention

The present invention relates to a thin film integrated circuit device including an integrated circuit such as a microprocessor (CPU), a memory. The present invention particularly relates to an IC card or a portable electronic device typified by a PDA and a cellular telephone.

2. Description of the Related Art

In recent years, as the field where an IC card is used is broaden, demand for an IC card having multifunctionality has been increasing. On the other hand, unauthorized use of IC cards increases and the countermeasure is urgently needed. An approach to the accurate personal-identification can be given as a countermeasure for the unauthorized use. As for a generally available IC card, the management using a personal identification number (PIN number) or a password, or printing a photograph of the face in a part of the card are given as methods for personal identification. Further, a method in which personal identification data stored in an IC card may be matched with personal data stored in an external device, so that validation is conducted (Reference 1: Japanese Patent Laid-Open No. 2000-215295). Still further, another method in which a user inserts the IC card in which fingerprint data and a log-on ID are stored beforehand into a read/authentication system and a fingerprint image is read by a fingerprint scanning area of the read/authentication system (Reference 2: Japanese Patent Laid-Open No. 2002-258975).

However, when a PIN number, a password, or a photograph of the face provided on a part of a card is used, in case of loss or theft, a person other than the identical person might tamper the contents and use the card illegally. Further, the display area of a card is limited, and thus, the information that can be provided is limited.

Further, when the data relating to an identical person (individual) is displayed on the external input device as disclosed in Reference 1, the personal information might flow out to a third party, particularly to a person who manages the external device. Moreover, when a read/authentication system carrying a fingerprint scanner is used as disclosed in Reference 2, the cost of equipment becomes higher to introduce the necessary apparatus.

BRIEF SUMMARY OF THE INVENTION

In view of the above problems, it is an object of the present invention to provide a device including an integrated circuit, in which a display area thereof especially is filled with ingenuity, for example, an IC card. It is another object of the present invention to provide an IC card, a portable electronic device such as a PDA or a cellular telephone, or another device, which can perform plural displays in a display area (a display portion) provided in a limited area.

Considering the above objects, in a device including a thin film integrated circuit of the present invention (hereinafter referred to as a thin film integrated circuit device), a first display area and a second display area having transparency are provided and stacked together. According to the present invention, much information can be provided by stacking display of the first display (first display) and display of the second display area having transparency (second display), even if the display region has a little area. In other words, the area of the display region can be reduced.

The first display provides a static image (a still image) or a moving image (an animated image). For example, letters, graphics, symbols, or the display including those such as depictions, print, photographs, or the like can be used for display of the static image. In particular, in the case of an IC card using the present invention, a photograph of the face of the user is preferable to use. Further, a liquid crystal display device or a light-emitting device (a display device having a light emitting element such as an EL element), electron paper, or the like can be used for display of the moving image.

The second display provides a static image or a moving image. For example, a light-emitting device of a dual emission type in which light emission is performed upward and downward may be used. As for a dual emission light-emitting device, a pixel area of the light-emitting device has transparency since it is designed so that light is emitted upward and downward.

Either a passive matrix type or an active matrix type can be used for the light-emitting device. Especially, the passive matrix type is preferable because it has high transparency, since a semiconductor element having a switching function is not formed in the pixel area.

A display method of a light-emitting device includes full color display, multi-color display, or single color display. As for the full color display, there are two cases in which a light emitting element is formed by coloring RGB separately and in which all the light emitting elements are formed of a white light emitting material and color filters of RGB are used.

Incidentally, in the present invention, the stacking order of a static image and a moving image has no preference. In other words, a display area provided at the top of the laminate of plural display areas is required to have transparency.

Note that, a thin film integrated circuit of the present invention is a integrated circuit having a greatly thin semiconductor film as an active region. The thin film integrated circuit can be formed on a substrate having flexibility, which is made of a plastic material or the like (such a substrate is hereinafter referred to as a film substrate). On that account, the thin film integrated circuit of the present invention is far lighter compared with an integrated circuit formed on a conventional silicon wafer (so-called IC chip), it can be made thin, and it is hardly damaged even when it is dropped. Thus, the thin film integrated circuit of the present invention is suitable for a thin film integrated circuit device such as an IC card which requires lightweight, thinness of film, and high breaking strength. Further, a pixel area or a driver circuit area of a light-emitting device may be formed using the thin film integrated circuit of the present invention.

Further, the structure according to the present invention in which a first display area and a second display area are laminated together can be provided for other devices other than a thin film integrated circuit device. For example, a portable electronic device typified by a cellular telephone or a PDA can use the structure. In that case, the first display area can use a photograph, a liquid crystal display device, a light-emitting device or electron paper. In addition, the second display area having transparency may use a dual emission light-emitting device.

As thus described, the present invention can provide plural displays in a display area of a thin film integrated circuit device or a portable electronic device, and can provide much information.

DETAILED DESCRIPTION OF THE INVENTION

Embodiment Modes

Figure 1A:
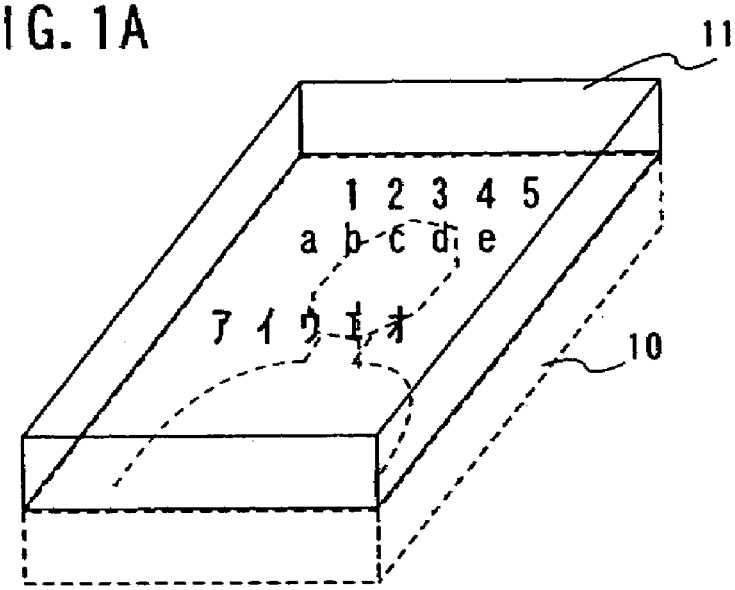
FIGS. 1A to 1C show a structure in which display areas of the present invention are laminated.

Embodiment modes of the present invention will be described below with reference to the accompanying drawings. However, the present invention can be embodied in many different modes; those skilled in the art can easily understand the purpose of the present invention; and the configuration and details can be changed variously without departing from its scope. Accordingly, the present invention is not to be interpreted with limitation to the defined content of the embodiment modes. Incidentally, the like reference numerals are referred to parts having the same part or the same function in all figures for describing the embodiment modes and the description of the parts will not be repeated.

Embodiment Mode 1

FIG. 1A shows a schematic view of a structure in which a first display area and a second display area are stacked together. A photograph is used for a first display area 10, and a dual emission light-emitting device is used for a second display area 11. The second display is shown by dotted lines and the first display is shown by a solid line.

Figure 1B:
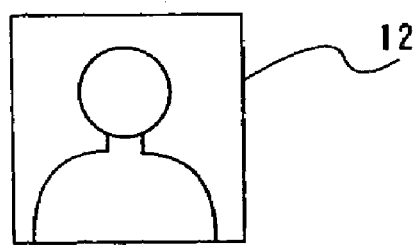

FIG. 1B shows a state where the power of a second display area, namely a dual emission light-emitting device, is OFF. A dual emission light-emitting device is transparent when the power is OFF and display is not performed; then, the first display 12 can be recognized. Displaying means of the first display area is not limited to a photograph, and a liquid crystal display device, a light-emitting display device, electron paper, or the like may be used as described above.

Figure 1C:
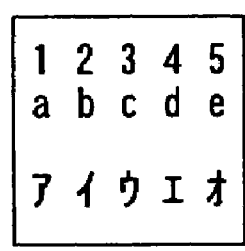
Figure 1C:
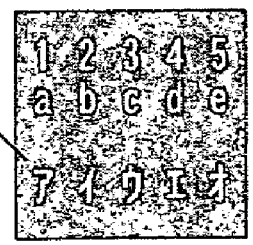

FIG. 1C shows a state where the power of the second display area is ON, and display of a light-emitting device, that is second display 13, can be recognized. When a dual emission light-emitting device is provided as the second display area, the content (characters and images) can be displayed in an OFF state while the back face is ON (FIG. 1C a). Alternatively, the display content can be displayed in an ON state while the back face is OFF (FIG. 1C b). Note that when the back face or the content is OFF, the second display area is transparent.

Even when the power of the dual emission light-emitting device is ON, that is when display is performed; it can be designated so that the first display is recognized. For example, emission intensity of the display device may be regulated, or an image with the use of ink (for example, fluorescent ink) reacting to light from the light-emitting device may be used for the first display area. Further, even when a character is displayed in a state where the back face of the second display area is OFF, the first display can be recognized due to the transparency covering much region. In that case, compositive display in which the first display area and the second display area are stacked together can be performed.

A thin film integrated circuit of the present invention denotes an integrated circuit having a greatly thin semiconductor film as an active region. And the thin film integrated circuit can be formed over a film substrate made of a plastic material or the like. On that account, the thin film integrated circuit of the present invention is far lighter compared with an integrated circuit (IC) formed on a conventional silicon wafer (so-called IC chip), it can be made thin, and it is hardly damaged even when it is dropped. Thus, the thin film integrated circuit of the present invention is suitable for a thin film integrated circuit device such as an IC card which requires lightweight, thinness of film, and high breaking strength. Further, a pixel area or a driver circuit area of a light-emitting device may be formed by using the thin film integrated circuit of the present invention.

Further, the structure according to the present invention in which a first display area and a second display area are stacked together can be provided for other devices besides a thin film integrated circuit device. For example, a portable electronic device typified by a cellular telephone or a PDA can use the structure. In that case, the first display area can use a photograph, a liquid crystal display device, a light-emitting device or electron paper. Also, the second display area having transparency may use the dual emission light-emitting device.

Thus, the present invention can be used for display with plural displays in a limited region of a thin film integrated circuit device or a portable electronic device, thereby providing much information.

Embodiment Mode 2

In this Embodiment Mode, a specific structure of a thin film integrated circuit device will be described by taking an IC card for instance.

Figure 2A:
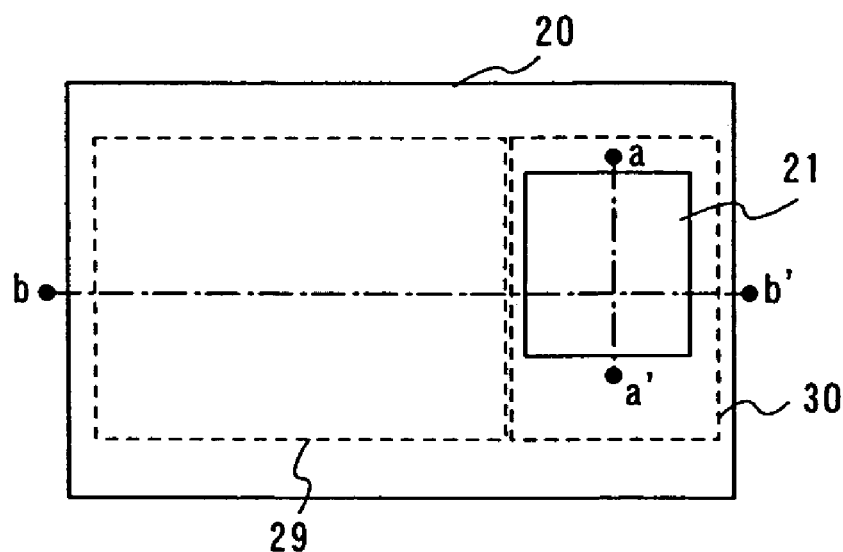
FIGS. 2A and 2B show a structure of a thin film integrated circuit device of the present invention.

FIG. 2A shows an IC card 20 including a first display area using a photograph, a second display area 21 using a light-emitting device of a dual emission type (a dual emission EL display device), a thin film integrated circuit area 29, and a driver circuit 30 (display peripheral circuitry) for display.

Figure 2B:
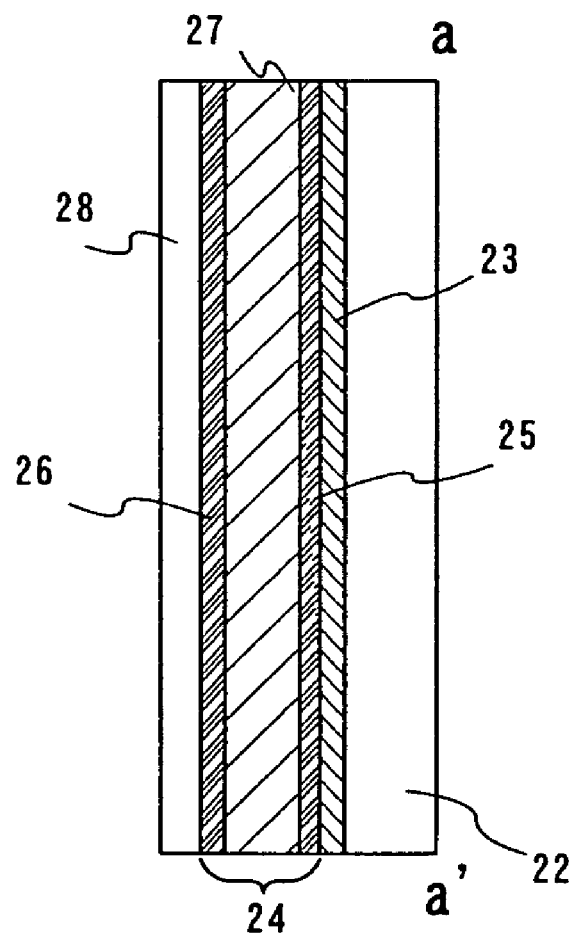

FIG. 2B shows an enlarged view of a cross section taken along the line a-a'. A first display area 23 is provided over a substrate 22 of an IC card and a second display area 24 is provided in the cross sectional view. The first display area may use a photograph and an image is displayed (the first display). The first display area is adhered after the first display area is adhered on a substrate or an opening is formed in the substrate. A dual emission light-emitting device that is to be a second display area has a layer including an organic compound (hereinafter referred to as an organic compound layer) 27 positioned between a first transparent conductive film 25 and a second transparent conductive film 26. Further, a protective film 28 is provided on the second display area. The whole thin film integrated circuit may be covered with the protective film.

The first and the second transparent conductive films, and the organic compound layer have transparency; therefore, the first display can be recognized. In an active matrix light-emitting device, a semiconductor element that functions as a switch for each pixel is provided; however, since the element is very small, the second display area can have transparency. Further, in a passive matrix light-emitting device, there is no semiconductor element that functions as a switch; thus, higher transparency can be acquired.

Figure 3A:
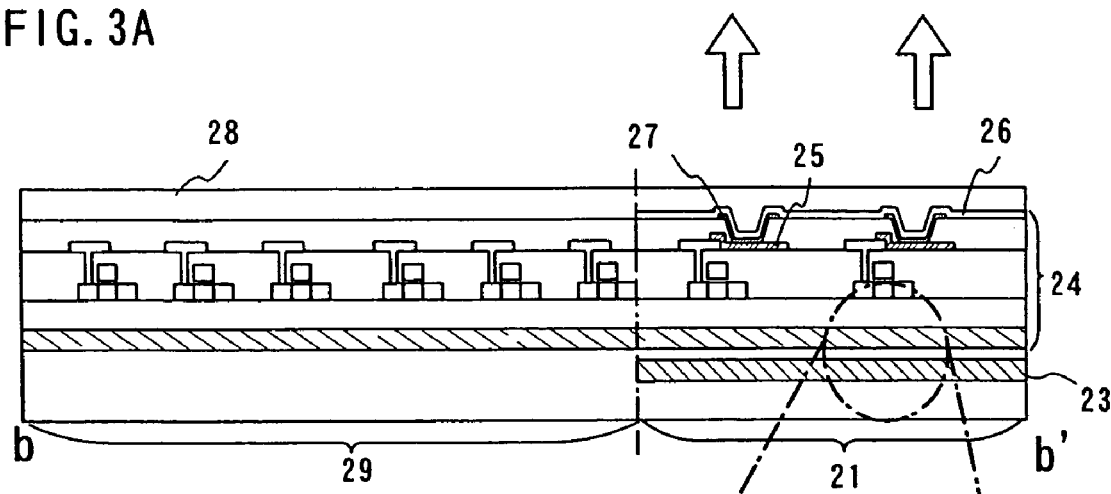
FIGS. 3A and 3B show a structure of a thin film integrated circuit device of the present invention.

FIG. 3A shows a cross-sectional view taken along the line b-b' of FIG. 2A. A display area 21 in which the first display area and the second display area are stacked together and a thin film integrated circuit area 29 are provided. In thin film integrated circuit area, memories such as a CPU (Central Processing Unit), a ROM (Read Only Memory), a RAM (Random access memory), or EEPROM (Electronically Erasable and Programmable ROM); an I/O port, a coprocessor, an interface, or the like are formed from the thin film integrated circuit of the present invention. Thin film integrated circuit area may have a signal line driver circuit or a scanning line driver circuit of a display area for the second display area each of which is formed by a thin film integrated circuit of the present invention. As thus described, a thin film integrated circuit area formed from a greatly thin film integrated circuit of the present invention is suitable for an IC card, whose size and thickness can be limited by regulations.

A first transparent conductive film 25 connected to a thin film transistor, an organic compound layer 27, and a second transparent conductive film 26 are stacked in order in the second display area 24.

Figure 3B:
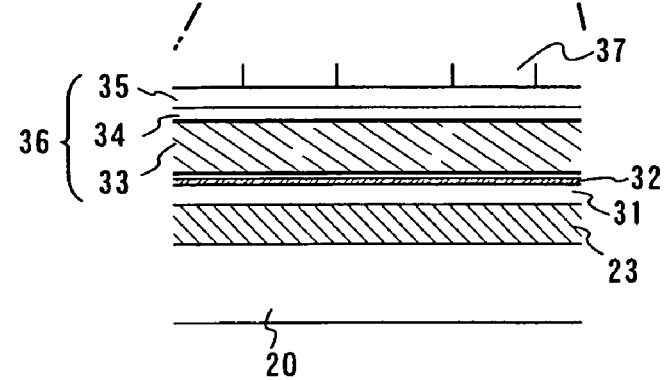

FIG. 3B shows an enlarged view of a boundary between the first display area and the second display area. On the first display area 23 provided over a substrate 20, a protective film 31 for protecting the first display area and protecting a thin film transistor from contamination is provided. On the protective film, an insulating layer 36 is provided with an adhesive 32 therebetween, and a semiconductor thin film (a semiconductor film) 37 having an impurity region is provided. An insulating layer can have a single layer structure or a layered structure, and an oxide film 33 containing silicon, a first base insulating film 34, and a second base insulating film 35 are laminated in order in this embodiment mode. Note that, the base insulating film may have either a single layer structure or a layered structure having more than three layers. The adhesive may be a thermosetting resin, an ultraviolet curable resin, or a two-sided tape.

It is not illustrated; however, when the thin film integrated circuit of the present invention is peeled and transferred onto the first display area, a metal oxide would be attached to the bottom of the second display area. Note that, the metal oxide may be removed before the first display area is transferred.

In the case of an IC card including an antenna, the antenna may be formed by printing or photo etching using photolithography using a conductive material with silver, copper, or aluminum.

In this embodiment mode, the description is made by taking a thin film integrated circuit device; however, it is not limited thereto, and the present invention is also applicable to portable electronic devices. In the case of a portable electronic device, a light-emitting device or a thin film integrated circuit area can be formed by using a thin film integrated circuit of the present invention, a thin film transistor formed on glass, or a transistor including a silicon wafer; thus, the design latitude can be broaden.

As described above, since the second display area has transparency, a laminate of display areas can be formed, and compositive display is enabled. Consequently, diverse displays can be performed without increasing the area of a display area. When a photograph is used for the first display area, the burden on the thin film integrated circuit can be reduced compared with the case using a display device. A photograph may be used for the first display area in the case of a thin film integrated circuit device such as an IC card or the like, whose size is limited by regulations.

Embodiment Mode 3

In this embodiment mode, a specific structure of a thin film integrated circuit device will be described by taking an IC card for instance. In this embodiment mode, an IC card can use a contact type having an electrode on the surface, a contactless type having an antenna inside, a hybrid type that is a combination of the above two types, or a dual interface type. As for parts in the following description, visible parts formed over the surface of the IC card are shown by a solid line, and other parts formed inside the IC card are shown by dotted lines.

Figure 4A:
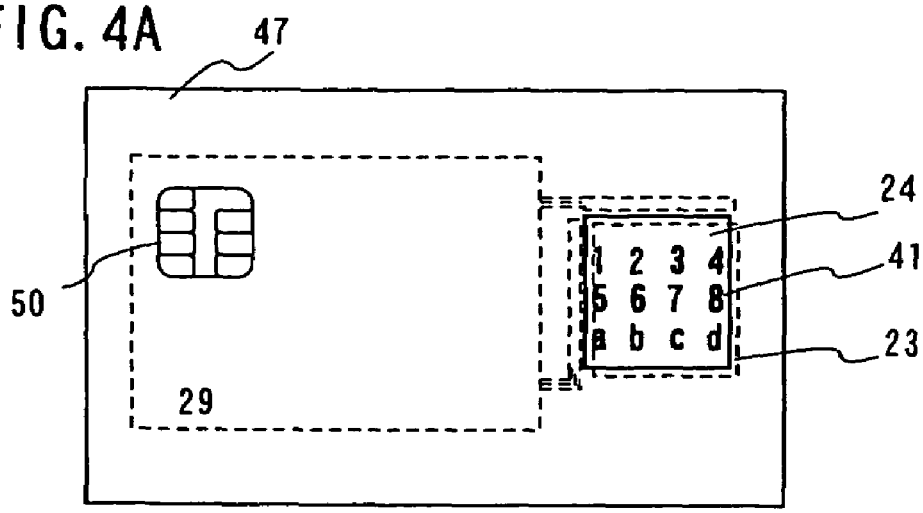
FIGS. 4A to 4C show a structure of an IC of the present invention.

FIG. 4A shows a contact IC card 47 having a terminal 50, a first display area 23, and a second display area 24. As an example of the contact IC card, the first display area and the second display area are stacked and combined together; thus, a PIN number or a password 41 can be displayed. Hereupon, display can be performed in a state where the first display area and the second display area overlap by making the second display area transparent; a PIN number or a password 41 can be displayed only when the display areas are stacked.

Figure 4B:
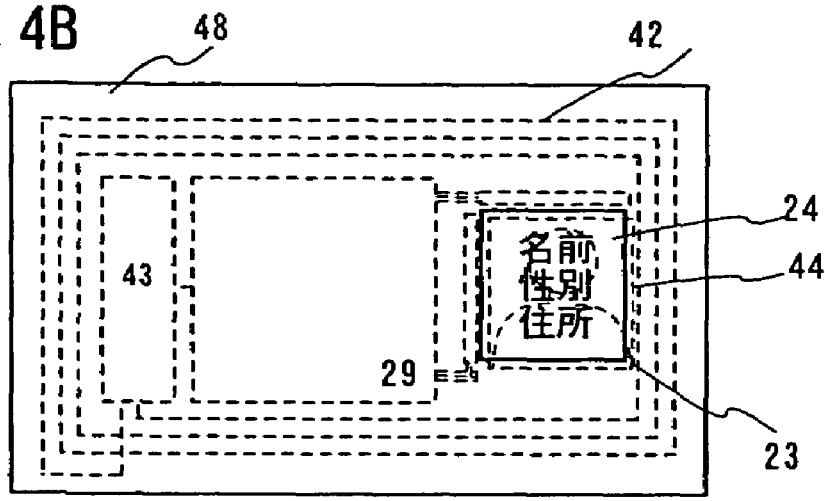

FIG. 4B shows a contactless IC card 48, including a thin film integrated circuit area 29 having an antenna 42, a current circuit 43, a CPU 33, and a memory 34 and the like; the first display area 23; the second display area 24; and the antenna is connected to the thin film integrated circuit area via the current circuit. A current circuit 32 has a diode and a capacitor, for example, and has the function for converting AC frequency which the antenna receives to DC frequency.

Fabrication conditions of the antenna may be set appropriately; the antenna is formed, for example by etching a wiring material of the thin film integrated circuit into a desired shape; by employing printing using a conductive paste (specifically, a conductive paste such as silver, copper, or aluminum); or by forming a depression in a second interlayer insulating film, pouring an antenna material into the depression, and patterning it by etchback. The antenna may be formed in the same layer as the wiring of the thin film integrated circuit and may be formed at the same time as the wiring. For example, the antenna can be formed simultaneously with a gate electrode, a source wiring, a drain wiring, a signal line, a scanning line, or a power supply line of the thin film integrated circuit. On that occasion, the antenna can be formed from the same material as the wiring of the thin film integrated circuit.

Personal identification is performed by a first display area 23 and personal information 44 is displayed by a second display area 24. A PIN number or a password may also be displayed there. At that time, display of the second display area is set to prevent others from seeing the first display area therethrough. For example, display of the second display area may be managed by using a password.

Figure 4C:
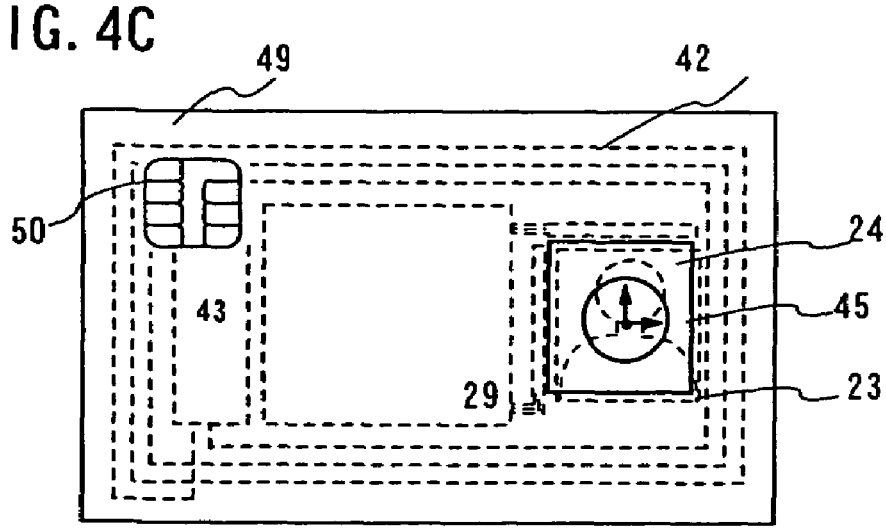

FIG. 4C shows a hybrid IC card 49 including a terminal 50, an antenna 42, a current circuit 43, a first display area 23, and a second display area 24. The antenna may be formed according to the method mentioned above.

An example in which display for personal identification is performed by the first display area 23, and display for multi-purpose 45 such as display of a calendar or a clock, besides the balance, or a route may be shown in the second display area 24.

As for such an IC card, when a photograph is used in the first display area, display of a the first display area can be emphasized by using fluorescence ink that emits light by light from the light-emitting device, that is, the second display area. Thus, display using the combination of the first display area and the second display area is enabled. At that time, it is more preferable that the back face of the second display area is turned OFF (namely, in a transparent state), or is dimmed or adjusted.

Note that an IC card of a each type and the application of the first and a second display areas may be combined freely According to the present invention, the second display area has transparency, and the first display area should be recognized in the state where even parts of the first display area and the second display area overlap. Further, the first display area or the second display area may be provided over the whole surface of a thin film integrated circuit device or a portable electronic device. However, in the case of an IC card, the display areas should be provided under certain conditions, for example, the region to be provided with an opening for displaying a photograph is limited due to the strength.

Figure 5:
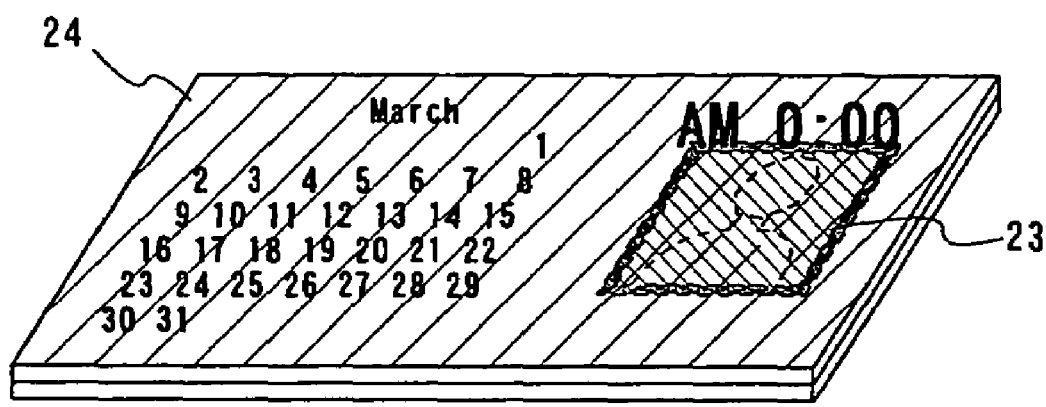
FIG. 5 shows a structure of an IC of the present invention.

As shown in FIG. 5, for example, a photograph of the face is arranged on the first display area 23 in a predetermined position of the IC card. And the second display area 24 is provided over the whole surface; thus, multipurpose display of such as a password or a PIN number, or time or a calendar can be performed.

Thus, according to the present invention, the first display area and a second display area are stacked together, so that plural displays can be performed even when the area is limited. Consequently, when certain information is displayed, for example, the area of a display area in a thin film integrated circuit device or a portable electronic device can be reduced.

Further, personal identification is performed by combining the first display area and the second display area, and user validation can be performed with a thin film integrated circuit device or a portable electronic device itself. As a result, the cost of equipment for the external device can be reduced. In addition, leakage of the PIN number or the password from the external device can be prevented. Moreover, compositive display of the password or the PIN number can be done by putting the first display area and the second display area together.

Further, since a thin film integrated circuit of the present invention is formed over a wide area of the card, the thin film integrated circuit area can be easily cut upon abandonment, and thus, illegal reuse of the card can be prevented.

Note that, display areas in this embodiment mode are laminated, and the stacking order of the first display area and the second display area may be set arbitrarily.

Embodiment Mode 4

In this embodiment mode, the description of a portable electronic device having a thin film integrated circuit and a display area formed over a printed circuit board or the like in the case where a second display area is designed larger than a first display area.

Figure 6A:
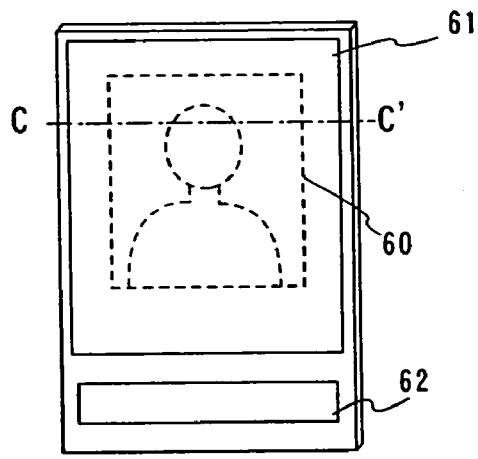
FIGS. 6A to 6D show portable electronic devices using the present invention.

FIG. 6A shows a PDA that is an example of a portable electronic device. The PDA includes a display area in which a first display area 60 and a second display area 61 are stacked, and a control area 62. In FIG. 6A, the size of the second display area is made larger than that of the first display area. Conversely, the size of the first display area may be larger than the second display area. Incidentally, the second display area is a passive matrix light-emitting device.

Figure 6B:
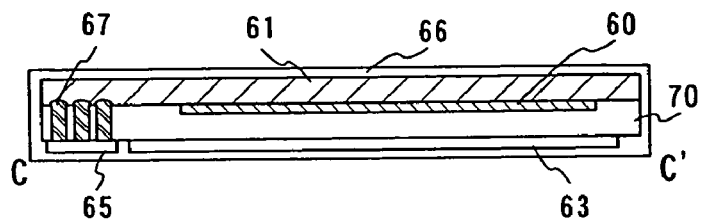

FIG. 6B shows a cross-sectional view of a state where the first display area 60 and the second display area 61 are provided over one surface of a printed circuit board 70; a thin film integrated circuit area 63 and driver circuit areas such as a signal line driver circuit area 64 and a scanning line driver circuit area 65 are provided over the other surface; and a protective film 66 covers the whole.

In the present invention, a pixel area and a driver circuit may be provided over the same surface; however, it is preferable to form the display area (including the first and the second display area) and the driver circuit area respectively over the different surfaces of the printed circuit board, thereby increasing the display area. In that case, a signal line, a scanning line, and an electrode provided over one surface are connected to a driver circuit and thin film integrated circuit area provided over the other surface by a conductive material (connection wire) that is poured into a through hole formed in a printed circuit board 67. Note that a thin film integrated circuit formed without using a method of the present invention may be provided in the control area.

Figure 6C:
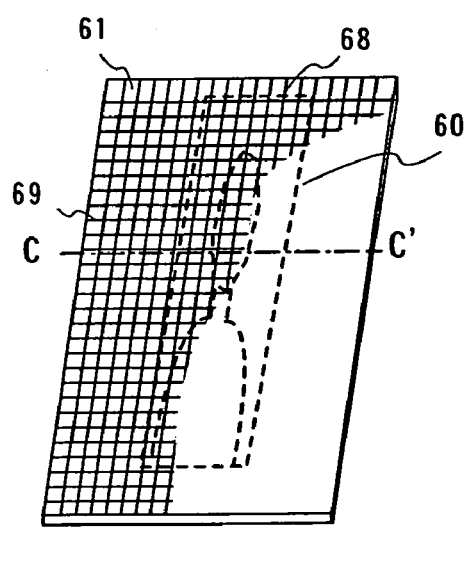

FIG. 6C shows one surface of the printed circuit board. The first display area 60 is disposed over the surface, and a signal line 68 and a scanning line 69 for the second display area 61 are provided so as to cross each other. A second display area having transparency can be provided by using a transparent conductive film for the scanning line and the signal line.

FIG. 6C shows a passive matrix light-emitting device; however, an active matrix light-emitting device can be used instead. In the case of a passive matrix light-emitting device, a semiconductor element for every pixel is not necessary; thus, high transparency can be obtained.

Figure 6D:
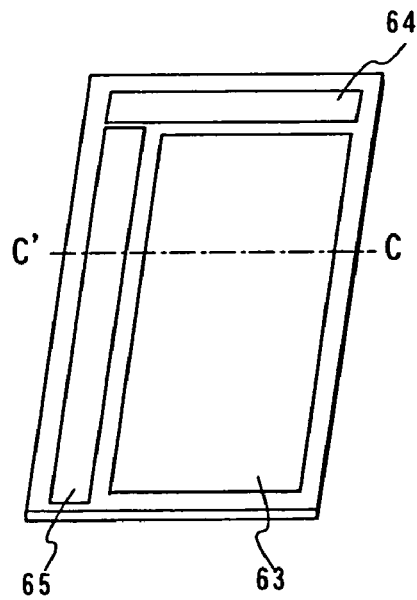

As shown in FIG. 6D, a signal line driver circuit 64, a scanning line driver circuit 65, and a thin film integrated circuit area 63 are provided over the other surface of the printed circuit board. The circuits can be formed greatly thin by using thin film integrated circuits according to the present invention.

As thus described, a display area can be made larger by providing a circuit or the like over a surface opposite to the display area.

The signal line driver circuit and the signal line, and the scanning line driver circuit and the scanning line are connected by using a conductive material poured into the through hole formed in the printed circuit board, or by using an anisotropic film (ACF: Anisotropic Conductive Film). Further, a plurality of thin film integrated circuits may be stacked by flip chip assembly.

A protective film 66 is provided in the end, and thus, the portable electronic device in which the entire surface is provided with the second display area is completed.

Thus, the first display area and the second display area can be arranged freely.

In this embodiment mode, a thin film integrated circuit is used for the description; however, especially for a portable electronic device, an integrated circuit and a driver circuit may be formed from a thin film transistor (TFT) on glass or from a transistor using a silicon wafer.

This embodiment mode can also be applied to a thin film integrated circuit device. The thin film integrated circuit of the present invention is suitable for a thin film integrated circuit of an IC card or the like due to its extreme thinness as described above. However, in the case of an IC card which is an example of a thin film integrated circuit device, it is necessary to adjust the thickness of the printed circuit board or the thickness of the thin film integrated circuit when the thickness is limited by regulations.

Embodiment Mode 5

In this embodiment mode, other usage of the present invention will be described.

Figure 9A:
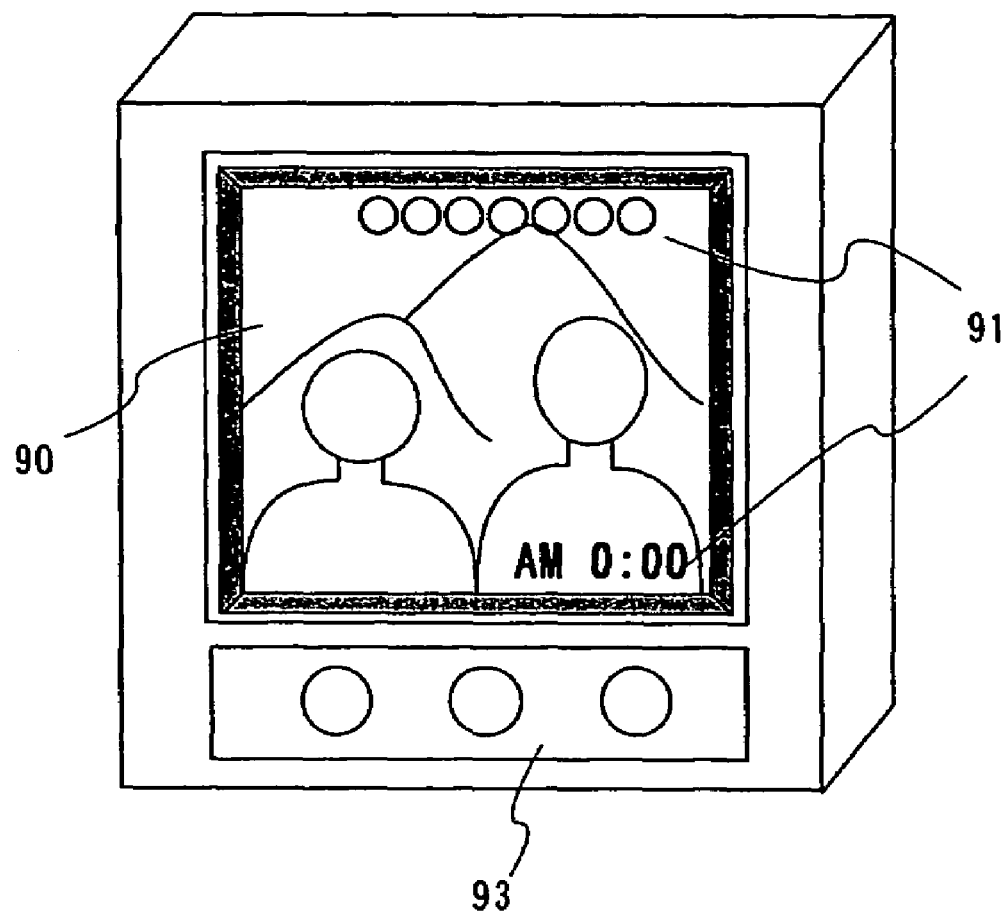
FIGS. 9A and 9B show examples of products including a thin film integrated circuit of the present invention.

FIG. 9A shows an example of using the present invention for a photo frame. First, a photograph is used for a first display 90, and a design as well as comment or time are displayed by using a dual emission light-emitting device for the second display 91. A power button, an input button, a switching button, or the like for display are provided in a control area 93. The comment content can be updated by using the input button. The photo frame is appropriately provided with circuits such as a power supply circuit a driver circuit, and other devices that are necessary for display of the dual emission light-emitting device.

Figure 9B:
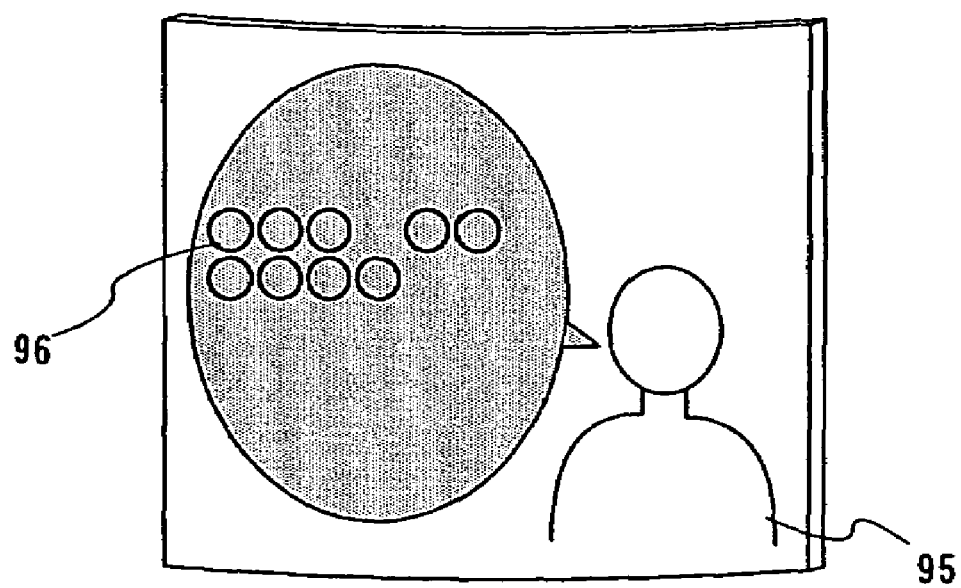

FIG. 9B shows example of a display sheet with the use of the present invention, which is adhered to a predetermined position. For example, a picture or a photograph is used for the first display 95, the content of a message or an E-mail is displayed by using a dual emission light-emitting device for a second display 96. Further, the second display can display black color by making the first display below the second display show a black image or the like. The display sheet is appropriately provided with circuits such as a power supply circuit, a driver circuit, other devices that are necessary for display of the dual emission light-emitting device, and a receiving function. The dual emission light-emitting device is manufactured using a flexible substrate of the present invention, so that the display sheet can be adhered to what has a curved surface, or the display sheet may be detachable.

According to the present invention, display is done in a state where the first display area and the second display area stacked together. Accordingly, size and shape of the first display area and the second display area are not required to be uniform. The application range of the present invention is wide enough to be applicable to every product. Further, a light-emitting device of the present invention is greatly thin, so that it can be provided for a product having a curved surface.

Embodiment Mode 6

In this embodiment mode, a manufacturing method of a thin film integrated circuit of the present invention, a method for forming a thin film transistor over a film substrate by using peeling and transfer techniques will be described.

Figure 7A:
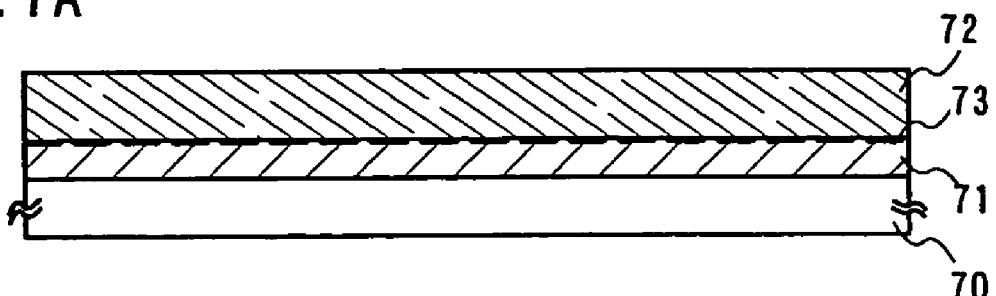
FIGS. 7A to 7E show fabricating steps of a thin film integrated circuit of the present invention.

First, a metal film 71 is formed over the first substrate 70 as shown in FIG. 7A. The first substrate should have rigidity that can withstand the following peeling step, for example, a glass substrate, a quartz substrate, a ceramic substrate, a silicon substrate, a metal substrate, or a stainless steel substrate may be used. For the metal film, a single layer of an element selected from W, Ti, Ta, Mo, Nd, Ni, Co, Zr, Zn, Ru, Rh, Pd, Os, and Ir, or an alloy material or a compound material which is based on the element; or a laminate thereof can be used. For an example of a method for forming a metal film, the metal film may be formed by sputtering using a metal target. The metal film may be formed to have a film thickness of from 10 nm to 200 nm, preferably, from 50 nm to 75 nm.

Instead of a metal film, a film containing nitride of the above metal (for example, tungsten nitride or molybdenum nitride) may be used. Further, a film containing an alloy of the above metal (for example, an alloy of W and Mo: $W_xMo_{1-x}$) may be used instead of the metal film. In this case, an alloy film can be formed by sputtering using plural targets such as a first metal (W) and a second metal (Mo), or an alloy target of the first metal (W) and the second metal (Mo) in a film formation chamber. Oxygen or nitrogen may be further added to the metal film. For an example of a method for adding the metal, oxygen or nitrogen ion implantation, or sputtering in a film formation chamber of nitrogen and oxygen atmosphere can be given. In the latter case, a metal nitride material may be used as a target.

When the metal film is formed by sputtering, the film thickness of the peripheral area of a substrate may occasionally be uneven. On that account, it is preferable to remove the film of the peripheral area by dry etching. On that occasion, an insulating film containing nitrogen such as a silicon oxynitride (SiON and SiNO) film may be formed between the first substrate 70 and the metal film 71 to have a thickness of around 100 nm, so that the first substrate is not etched.

Thus, the peeling step can be controlled by appropriately setting a formation method of the metal film, so that the process latitude is improved. For example, in the case of using a metal alloy, the peeling step can be controlled by controlling the composition ratio of the respective metals in the alloy. Specifically, a heating temperature for peeling as well as use or disuse of heat-treatment can be controlled.

Thereafter, a peeled layer 72 to be peeled is formed over the metal film 71. This peeled layer has an oxide film containing silicon, a semiconductor film, and an element of a dual emission light-emitting device, in the case of contactless IC cards, an antenna may be also provided. Further, the dual emission light-emitting device can take various orders of steps upon peeling. For example, peeling is performed in any of the following states: a first transparent conductive film is formed, a light emitting material is formed, or another element is formed; and any element that is formed can be a peeled layer peeled.

It is preferable to form an insulating film containing nitrogen such as a silicon nitride (SiN) film or a silicon oxynitride (SiON and SiNO) film as a base film in a position lower than the peeled layer 72, especially under a semiconductor film for preventing impurities and dust from penetrating through the metal film or the substrate.

Silicon oxide or silicon oxynitride may be formed for the oxide film containing silicon by sputtering or CVD method. Further, the film thickness of the oxide film containing silicon is desirably more than twice that of the metal film. In this embodiment mode, a silicon oxide film is formed to have a film thickness of from 150 nm to 200 nm by sputtering using a silicon target.

When the oxide film containing silicon is formed, an oxide containing the metal 73 (a metal oxide) is formed over the metal film. Further, the metal oxide can use a thin metal oxide formed on the metal film surface by treating the metal film with an aqueous solution including sulfuric acid, hydrochloric acid, or nitric acid; an aqueous solution in which sulfuric acid, hydrochloric acid, or nitric acid and oxygenated water are mixed or ozone water. As another alternative, the metal oxide may be formed by oxidation of ozone generated by plasma treatment in an oxygen atmosphere or UV radiation in an oxygen atmosphere, or formed by heat treatment at from 200° C. to 350° C. using a clean oven.

The metal oxide may be formed so as to have a film thickness of from 0.1 nm to 1 μm, preferably 0.1 nm to 100 nm, further preferably 0.1 nm to 5 nm.

The oxide film-containing silicon provided between a semiconductor film and the metal film, and the base film are collectively referred to as an insulating layer. In other words, a structure in which a metal film, a metal oxide, an insulating layer, and a semiconductor film are laminated, that is, a structure in which one surface of an insulating layer is provided with the semiconductor film, and the other surface is provided with a metal oxide and a metal film shall be taken.

A semiconductor element such as a thin film transistor (TFT) is formed by applying a predetermined fabrication process to the semiconductor film. An organic TFT, a thin film diode, and the like are formed in addition to the thin film transistor. Those semiconductor elements form a CPU or a memory of the thin film integrated circuit. The semiconductor elements are further used as a switching element for driving a light emitting element, or as an element of a driver circuit. It is preferable to provide a protective film containing carbon such as a diamond like carbon (DLC) film or a carbon nitride (CN) film, or a protective film containing nitrogen such as a silicon nitride (SiN) film or a silicon oxynitride (SiNO or SiON) film over the semiconductor elements.

After forming the above described peeled layer 72; specifically, after the metal oxide is formed, heat treatment is appropriately performed to crystallize the metal oxide. Further, when W (tungsten) is used for the metal film, heat treatment is performed at around 400° C., preferably from 380° C. to 410° C. For example, a metal oxide of $WO_2$ or $WO_3$ is crystallized by heating at 400° C. Further, in the case where heat treatment is performed after forming the semiconductor film of the peeled layer 72, hydrogen in the semiconductor film can be diffused. It is considered that the hydrogen may cause a change in the valence of the metal oxide. Whether the heat treatment is necessary as well as the temperature thereof may be determined according to the selected metal of the metal film. If necessary, the metal oxide may be crystallized thereby performing the peeling readily.

Further, heat treatment in a process for manufacturing the semiconductor element may be performed concurrently with the heat treatment of the above step, thereby reducing the number of the steps. For example, the heat treatment may be performed by a heating oven or laser irradiation which is used when a crystalline semiconductor film is formed.

Figure 7B:
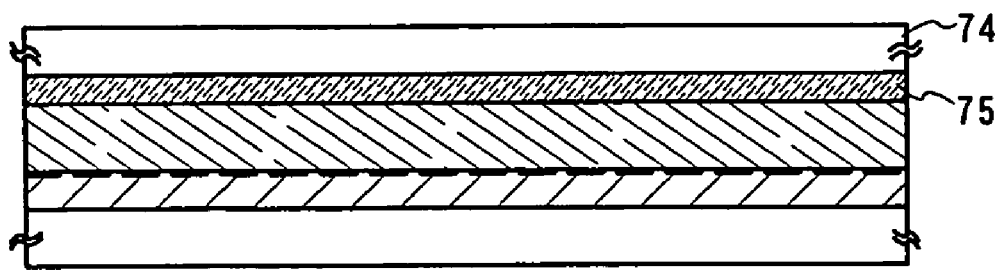

Subsequently, the peeled layer 72 and a second substrate 74 are pasted together with a first adhesive 75 as shown in FIG. 7B. Note that it is preferable to use a substrate with rigidity that is higher than that of the first substrate 70 for the second substrate 74. For example, a peelable adhesive such as a ultraviolet peelable type that is removed by ultraviolet rays, a heat peelable type that is removed by heat, a water-soluble adhesive that is removed by water; or a two-sided tape may preferably be employed for the first adhesive 75.

Figure 7C:
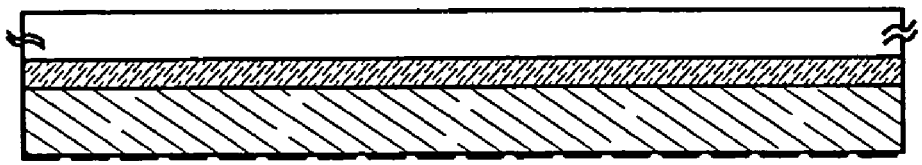

The first substrate 70 provided with the metal film 71 is peeled by using physical means (FIG. 7C). The separation occurs in a layer of the crystallized metal oxide or at the boundaries (interfaces) at both surfaces of the metal oxide, that is, at the interface between the metal oxide layer and the metal film or at the interface between the metal oxide and the peeled layer; although it is not illustrated since the figure shows a frame format. Thus, the peeled layer 72 can be peeled from the first substrate 70.

It is preferable to cut a part of the substrate and to scratch the peeled interface on the cut surface, that is, the vicinity of the interface between the metal film and the metal oxide film by using a cutter or the like thereby performing the peeling readily.

Figure 7D:
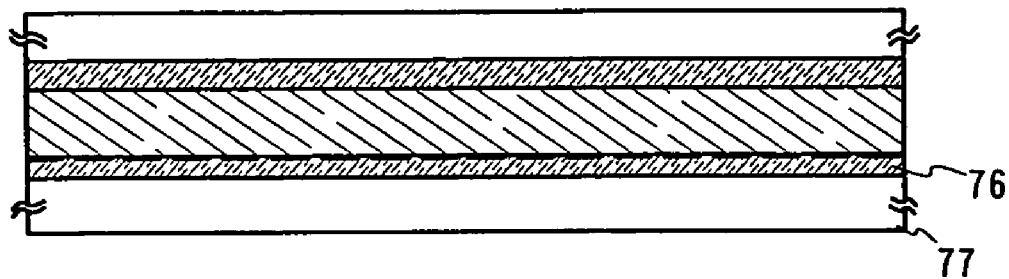

As shown in FIG. 7D, the peeled layer 72 is pasted to a third substrate 77 that is to be a transfer body by using the second adhesive 76. When a thin film integrated circuit device is fabricated, it is preferable that a substrate of the device is used as the third substrate, and the peeled layer is directly pasted on the substrate of the device. For example, in the case of an IC card on which a photograph is provided as a first display area, the photograph is pasted on a substrate of the IC card with the second adhesive. An adhesive such as an ultraviolet curable resin, specifically an epoxy resin adhesive, or a resin additive; a two-sided tape; or the like may be used for the second adhesive 76. Note that, when the surface of the third substrate is adhesive, the second adhesive is not necessary.

A film substrate with flexibility, for example, paper or a plastic substrate such as a substrate of polyethylene terephthalate, polycarbonate, polyarylate, or polyethersulfone may also be used for the third substrate. Further, the third substrate may be pasted to a substrate of the substrate of the thin film integrated circuit device.

Figure 7E:

Thereafter, the first adhesive 75 is removed and the second substrate 74 is peeled (FIG. 7E). Specifically, ultraviolet irradiation, heat treatment, or water washing may be performed to peel the first adhesive.

Note that the removal of the first adhesive and the curing of the second adhesive may be performed in one step. For example, when the first and the second adhesives respectively use a heat peelable resin and a thermosetting resin, or an ultraviolet peelable resin and an ultraviolet curable resin, the removal and curing can be performed in one step of heating or ultraviolet irradiation. The adhesive should be selected appropriately in consideration of the transparency and the like of the third substrate.

Thereafter, a protective film is formed and/or laminated, and thus a thin film integrated circuit device of the present invention is completed.

Note that the metal oxide 73 would be completely removed form the thin film integrated circuit device, or a part or most of the metal oxide 73 would be scattered (remained) on the under surface of the peeled layer. When the metal oxide remains, it may be removed by etching or the like. Further, at that time, the oxide film containing silicon may also be removed.

Using the methods above, a plurality of thin film integrated circuits are formed over one large substrate. Consequently, mass production of thin film integrated circuits is enabled. Accordingly, thin film integrated circuit devices can be manufactured at a low cost.

Other than the delamination and transfer described above, the fabrication method of the thin film integrated circuit of the present invention may alternatively employ a step of peeling the delamination layer from the first substrate by laser irradiation, or etching the first substrate and transferring the delamination layer to the third substrate.

As an alternative peeling method, a hydrofluoric acid etching solution is used for removal, or a glass substrate may be removed by grinding.

Such an integrated circuit according to the present invention is greatly thin since it is formed from a thin semiconductor film with a thickness of from 250 nm to 750 nm, preferably 500 nm at most, while an integrated circuit formed from a silicon wafer with a film thickness of around 50 μm. For example, when the thin film integrated circuit includes a semiconductor film that is to be an active element, a gate insulating film, a gate electrode, an interlayer insulating film, a wiring, and a protective film, especially, a thin film integrated circuit that is exceedingly thin as from 1500 nm to 3000 nm can be formed. As a result, the thin film integrated circuit of the present invention is suitable for a thin film integrated circuit device such as an IC card.

The thin film integrated circuit according to the present invention does not require back-grinding that cause a crack or grinding marks unlike an IC formed from a silicon wafer. The irregularity of the film thickness of the thin film integrated circuit depends on the irregularity that is generated on film formation of a semiconductor film or the like. Therefore, the irregularities of the film thickness of the thin film integrated circuit can be reduced to at most about several hundred nanometers which is considerably less than the irregularities that is generated during wafer back-grinding.

Further, a greatly thin film integrated circuit of the present invention can be stacked. In that case, each thin film integrated circuit may be electrically connected together by flip chip assembly. In particular, when fabricating a thin film integrated circuit device whose area is limited, like an IC card, it is preferred to stack display areas together.

Embodiment Mode 7

In this embodiment mode, a fabrication method of an EL module of a dual emission light-emitting device, which can be used especially for a second display area will described.

Figure 8A:
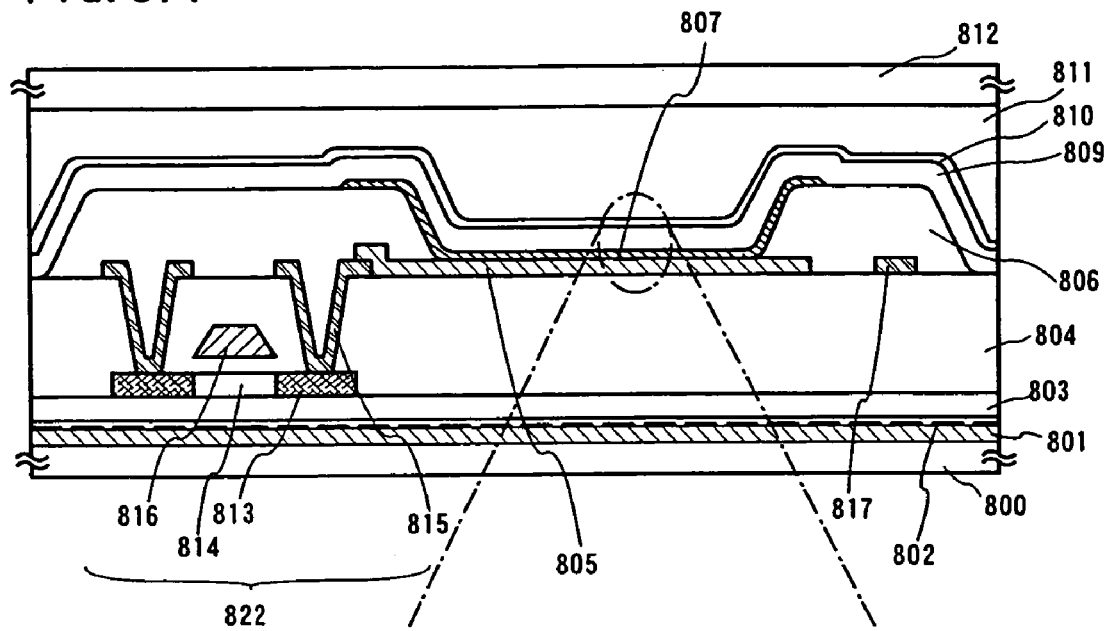
FIGS. 8A and 8B show a light-emitting device having transparency according to the present invention.
Figure 8B:
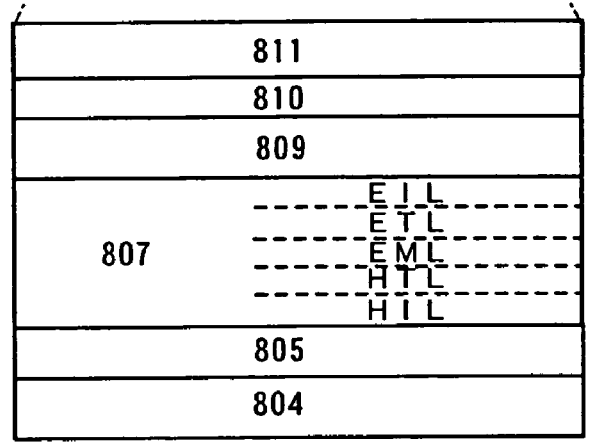

FIG. 8A shows a cross section of a dual emission EL module. FIG. 8B show a enlarged layered structure of a light emitting element of the EL module (having an organic compound layer, a first transparent conductive film, and a second transparent conductive film).

FIG. 8A shows a first substrate 800, a first display area 801, a metal oxide 802, a base insulating film 803, a TFT 822, a first transparent conductive film (electrode) 805, an insulator (referred to as a bank) 806, an organic compound layer 807, a thin metal film 808, a second transparent conductive film (electrode) 809, a protective film 810, a gap 811, and a second substrate 812.

The TFT 822 (p-channel TFT) provided on the first substrate 800 is an element for controlling a current flowing in the organic compound layer 807, and the TFT 822 includes an impurity region 813 serving as a drain region (or a source region), a channel region 814, and a gate electrode 816 provided over the channel region. Further, the TFT 822 is connected to the first transparent conductive film 805, and the TFT 822 further includes a drain electrode (or a source electrode) connected to a drain region (or a source region) 815. Further, a wiring 817 such as a power supply line or a source wiring is simultaneously formed in the same step as the drain electrode 815.

The insulating layer 803 to be a base insulating film (having an insulating nitride film as the lower layer, and an insulating oxide film as the upper layer) is formed on the first substrate 800, while a gate insulating film is provided between a gate electrode 816 and an active layer. Further, an interlayer insulating film 804 is formed to contain an organic material or an inorganic material. Although not illustrated here, one TFT (n-channel TFT or p-channel TFT) or a plurality of TFTs are provided per pixel. A TFT having one channel region 303 is described; however, the TFT may also have a plurality of channels.

The description given here takes a top gate TFT as an example. However, the present invention is applicable to any TFT structure. For instance, the invention can be applied to a bottom gate (inverted staggered) TFT and a staggered TFT.

The first transparent conductive film 805 is to be an anode (or cathode) of the light emitting element. ITO (indium tin oxide), indium oxide-zinc oxide alloy ($In_2O_3$—ZnO), ITO-$SiO_x$ that is a mixture of indium oxide and silicon oxide ($SiO_2$) of from 2% to 20% (expediently referred to as ITSO or NITO), zinc oxide (ZnO), or the like can be used for the transparent conductive film.

The light-emitting device has the insulator 806 (referred to as a bank, a partition, a barrier, a mount, and the like) covering an edge portion of the first transparent conductive film 805 (and the wiring 817). An inorganic material (such as silicon oxide, silicon nitride, or silicon oxynitride), a photosensitive organic material or a non-photosensitive organic material (such as polyimide, acrylic, polyamide, polyimidamide, resist, or benzocyclobutene), a laminate of those materials, or the like can be used for the insulator 806. An insulator having a photosensitive organic resin covered with a silicon nitride film is used in this embodiment mode. A curved surface having a curvature radius only in an upper edge portion of the insulator is preferably provided in the case of using a positive type photosensitive acrylic as the organic resin material, for example. Further, a negative type photosensitive organic material that becomes insoluble in etchant by light, and a positive type photosensitive organic material that becomes soluble in etchant by light, can be used as the insulator.

In addition, an organic compound layer 807 is formed by vapor deposition, coating, or ink jet. According to this embodiment, a uniform film thickness is provided by forming the organic compound layer 807 in a vapor deposition system. Note that, deaeration is preferably conducted by performing vacuum heat treatment (from 100° C. to 250° C.) just before forming the organic compound layer 807, in order to improve reliability. For example, when vapor deposition is used, vapor deposition is performed in a film formation chamber that is vacuum-evacuated to a pressure equal to or less than $5 \times 10^{-3}$ Torr (0.665 Pa), preferably from $10^{-6}$ Pa to $10^{-4}$ Pa. The organic compound is vaporized in advance by heating in a vapor deposition, and is scattered toward a substrate by opening a shutter at the time of a vapor deposition. The vaporized organic compound is scattered upward, and is deposited on the substrate after passing through an opening portion formed in a metal mask.

As shown in FIG. 8B, in an organic compound layer (EL layer) 807, an HIL (hole injection layer), an HTL (hole transport layer), an EML (light emitting layer), an ETL (electron transport layer), and an EIL (electron injection layer) are stacked in order from the anode side. Typically, CuPc for an HIL, α-NPD for an HTL, BCP for an ET, and BCP:Li for an EIL are used respectively.

As for the organic compound layer (EL layer) 807, in the case of full color display, specifically, a material layer showing luminescence of red (R), green (G), and blue (B) may be deposited appropriately and selectively by vapor deposition with the use of a deposition mask or by ink-jet respectively. Specifically, CuPc or PEDOT for an HIL, α-NPD for HTL, BCP or $Alq_3$ for an ETL, BCP:Li or $CaF_2$ for an EIL, are used respectively. For example, $Alq_3$ doped with a dopant corresponding to each luminous color of R, G, or B (DCM or the like for R, DMQD or the like for G) may be used for the EML.

Figure 10:
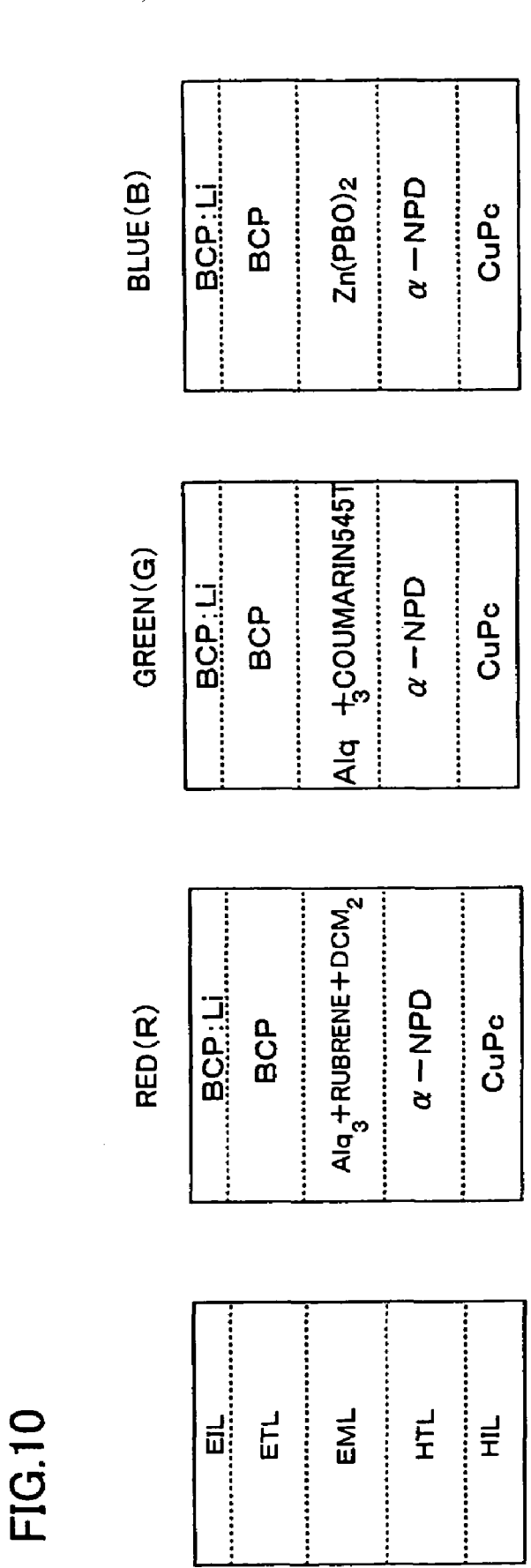
FIG. 10 shows a light-emitting device having transparency according to the present invention.

A layered structure of an organic compound layer is more specifically exemplified in FIG. 10. When the organic compound layer 807 that emits red light is formed, for example, after 30 nm thick CuPc and 60 nm thick α-NPD are formed, Alq$_3$ doped with DCM2 and rubrene is deposited to have a thickness of 40 nm as a red light emitting layer; BCP is deposited to have a thickness of 40 nm as an electron transport layer; and BCP doped with Li is deposited to have a thickness of 1 nm as an electron injection layer by using the same mask. When an organic compound layer that emits green light is formed, after 30 nm thick CuPc and 60 nm thick α-NPD is formed, Alq$_3$ doped with coumarin 545T is deposited as a green light emitting layer to be 40 nm in thickness, BCP is deposited as an electron transport layer to be 40 nm in thickness, and then BCP doped with Li is deposited as an electron injection layer to be 1 nm in thickness by using the same deposition mask. When the organic compound layer that emits blue light is formed, for example, after 30 nm thick CuPc and 60 nm thick α-NPD are formed, bis[2-(2-hydroxypheyl)benzoxazolate]zinc: Zn(PBO)$_2$ is deposited to have a thickness of 10 nm, 40 nm thick BCP is deposited as an electron transport layer, and 1 nm thick BCP doped with Li is deposited as an electron injection layer by using the same mask, thereby forming a light emitting layer.

CuPc and α-NPD common to such organic compound layers for the respective colors can be formed over the entire surface of the pixel area. Further, a mask can be shared with respective colors. For example, a red organic compound layer, a green organic compound layer, and a blue organic compound layer can be formed by suitably sliding the single mask. Note that the order of the formation can be decided fittingly.

Figures 11A, 11B, 11C:
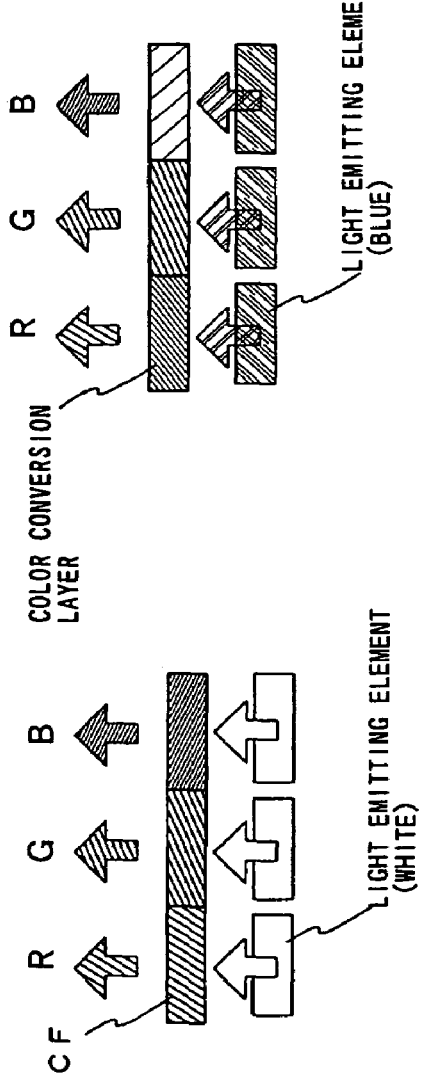
FIGS. 11A to 11C show a light-emitting device having transparency according to the present invention.

In the case of white light emission that is an example of single color light emission, full color display may be performed by separately providing a color filter, a color conversion layer, and the like. FIGS. 11A to 11C show an example of providing a color conversion filter or a color filter for a white light emitting element is shown. In FIG. 11A, a white light emitting element and a color filter are used. In FIG. 11B, a white light emitting element and a color conversion layer are used. In FIG. 11C, a white light emitting element, a color filter, and a color conversion layer are used. Thus, a color filter, or a color conversion layer and a color filter may be provided instead of a color conversion layer.

After the color filter or the color conversion layer for white light which is emitted upward is formed over the second substrate, the color filter or the color conversion layer may be pasted to the first substrate. After a drain electrode (or a source electrode) 815 is formed, a color filter or a color conversion layer for white light emitted downward can be formed over an insulating film. Thereafter, an insulating film and a second transparent conductive film are respectively formed over the color filter and the color conversion layer. The drain electrode drain electrode (or source electrode) 815 and the second transparent conductive film may be connected via a contact hole formed to the insulating film.

Single color light emission (typically, white color light emission) may be used for a display device or a lighting device that only performs simple display. For example, 1,3,4-oxadiazole derivative (PBD) having an electron transportation characteristic may be dispersed into polyvinyl carbazole (PVK) having a hole transportation characteristic. Moreover, white color light emission is obtained by dispersing 30 wt % of PBD as an electron transportation agent and by dispersing a suitable amount of four kinds of pigments (TPB, coumarin 6, DCM1, and Nile red). White color light emission can be obtained as a whole by appropriately selecting an organic compound films that emits red light, green light, and blue light, and then, by superimposing them and mixing the colors.

The second transparent conductive film 809 that serves as a cathode (or an anode) is formed over the organic compound film 807. For the material of the second transparent conductive film, an alloy such as MgAg, MgIn, AlLi, CaF$_2$, or CaN are made to form a transparent and very thin film. Alternatively, aluminum with an element belonging to group 1 or group 2 of the periodic table may be treated by co-deposition to form a thin transparent metal film. In the case of using an Al film for the second transparent conductive film 809, a material in contact with the organic compound layer 807 can be formed of a material other than an oxide. As a result, reliability of the light-emitting device can be improved. A transparent layer (having a thickness of from 1 nm to 5 nm) comprising CaF$_2$, MgF$_2$, or BaF$_2$ as a cathode buffer layer can be formed before forming an aluminum film having a thickness of from 6 nm to 10 nm. Further, similarly to the first transparent conductive film, ITO (indium tin oxide), indium oxide-zinc oxide alloy (In$_2$O$_3$—ZnO), zinc oxide (ZnO), or the like can be used for the second transparent conductive film.

In order to set the transmittance, absorptance, and reflectance of emission from a top surface and emission from a bottom surface to be same and to lower resistance of a cathode, a transparent conductive film (such as ITO (indium tin oxide), indium oxide-zinc oxide alloy (In$_2$O$_3$—ZnO), zinc oxide (ZnO), and the like) may be formed on a film of MgAg, MgIn, AlLi, CaF$_2$, CaN, or the like deposited to have transparency and a thickness of from 6 nm to 10 nm. The transparent conductive film is to have a film thickness ranging from 240 nm to 290 nm, or from 380 nm to 500 nm. In this way, a difference between a display of emission from a top surface and a display of emission from a bottom surface can be eliminated. An auxiliary electrode may be disposed over the second transparent conductive film 809 in a region that is not to be a light emitting region in order to lower the resistance of a cathode. When the cathode is formed, the cathode may be selectively formed using a vapor deposition mask by resistance heating due to the vapor deposition.

Note that the second transparent conductive film is formed by using ITO.

A transparent protective film 810 is formed by sputtering or vapor deposition, which not only protects the second transparent conductive film 809 but also prevents penetration of moisture. As for the protective film 810, a silicon nitride film, a silicon oxide film, a silicon oxynitride film (SiNO film (component ratio: N>O), SiON film (component ratio: N<O)), or a thin film containing carbon as a main component (for example, a DLC film or a CN film), which is obtained by sputtering or CVD, can be used. The protective film has a high blocking effect against moisture.

A protective film including a laminate of a first inorganic insulating film, a stress relaxation film, and a second inorganic insulating film may be formed for the protective layer. For example, after the cathode is formed, the first inorganic insulating film is formed to be 5 nm to 50 nm, a stress relaxation film (such as a layer including an organic compound) having hygroscopicity and transparency is formed by vapor deposition; and the second inorganic insulating film is formed to be 5 nm to 50 nm. A plurality of the laminate of a stress relaxation film and an inorganic insulating film may be further stacked in layers.

Thus formed protective layer 810 is fittest for a protective film of a light-emitting device using an organic compound layer for a light emitting layer. The second substrate 812 and the first substrate 800 are pasted together by a sealing material including a gap material for keeping the distance between the substrates.

In this embodiment mode, a plastic substrate such as FRP (Fiberglass-Reinforced Plastics), PVF (polyvinylfluoride), myler, polyester, or acrylic, or a coating film may be used as a material for a second substrate 812, other than a glass substrate and a quartz substrate.

An example in which the gap 811 formed between the pair of substrates is filled with inert gas is described in this embodiment mode; however, a transparent sealing material may also be used to fill the gap between the pair of substrates. There are no particular limitations for a sealing material to employ, as long as the material is transparent. Typically, an ultraviolet curable epoxy rein or a thermosetting epoxy resin may be used. Further, the transmittance can be generally improved by filling the gap between the substrates with a sealing material in comparison with the case where the gap is filled with inert gas.

Peeling and the like in this embodiment mode may take the following order of steps: forming the first transparent conductive film; peeling; transferring the peeled layer to the substrate provided with the first display area; and adhering the second substrate by forming the organic compound layer. Alternatively, after the light emitting layer is formed, the following steps may be taken: adhering the second substrate; peeling; and transferring the peeled layer to the substrate provided with the first display area. Accordingly, a dual emission light-emitting device of the present invention is not limited to the timing of peeling or transfer, which is described in Embodiment Mode 5. However, considering the strength and the state of the interfaces of the respective layers stacked together, it is preferable take the following order of steps: forming the first transparent conductive film; peeling and transfer are performed; the peeled layer is transferred to a substrate of a thin film integrated circuit device or the like; and a light emitting material is formed.

Further, when a thin film integrated circuit or a light-emitting device of the present invention is formed by peeling, the metal oxide 802 is occasionally formed underneath the base insulating film 803. As mentioned above, the metal oxide may be scattered or removed.

When thus fabricated dual emission EL module is provided as the second display area, light can be emitted from both the top surface and the bottom surface due to the transparency of the first electrode and the second electrode. Further, light-emitting device itself has transparency, so that the first display area arranged at the bottom can be recognized. By forming an integrated circuit of the present invention by using a thin film, a greatly thin dual emission EL module can be fabricated and it is suitable for an IC card.

Embodiment Mode 8

A first display can use a static image (rest image) or a moving image (an animated image). A second display can also use a static image or a moving image. Accordingly, in this embodiment mode, combination of the first display area and the second display area having transparency will be described.

First, the case of using a static image for the first display and a moving image for the second display will be described. In the first display, a static image displayed by using a photograph, a liquid crystal display device, a light-emitting device (a display device including a light emitting element such as an EL element), electron paper, or the like can be used as described above. Further, a dual emission light-emitting device displaying a moving image can be used for the second display. When a static image is used for the second display, the dual emission light-emitting device may display the static image.

When a moving image is used for the first display, a liquid crystal display device or a light-emitting device (a display device including a light emitting element such as an EL element), electron paper, or the like can be used. On that occasion, when a moving image is used for the second display, the dual emission light-emitting device may display the moving image. Otherwise, when a static image is used for the second display, the dual emission light-emitting device may display the static image.

In the present invention, the stacking order of a static image and a moving image has no preference. Accordingly, only a display area provided over the laminate of a plurality of display areas is required to have transparency.

Thus, the present invention enables plural displays in a display area of thin film integrated circuit device or a portable electronic device, thereby providing much information.

By providing a first display area and a second display area that are stacked together in a predetermined display area of a thin film integrated circuit device, a portable electronic device, or other products, the present invention makes it possible to reduce the area for display and to achieve plurality of displays, thereby providing much information and compositive display.

What is claimed is:

1. A thin film integrated circuit device comprising:
   a first display area;
   a thin film integrated circuit including a plurality of semiconductor films as a plurality of active region formed over an insulating film; and
   a second display area that is formed over the first display area and connected to the thin film integrated circuit,
   wherein the second display area is a dual emission light-emitting device.

2. A thin film integrated circuit device according to claim 1, wherein the first display area is a photograph.

3. A thin film integrated circuit device according to claim 1, wherein the first display area and the second display area are similar in size.

4. A thin film integrated circuit device according to claim 1, wherein the first display area and the second display area are combined whereby displaying letters, graphics, symbols or the combination thereof.

5. A thin film integrated circuit device according to claim 1, wherein the first display area displays a static image.

6. A thin film integrated circuit device according to claim 1, wherein the second display area displays a moving image.

7. A thin film integrated circuit device according to claim 1, wherein the thin film integrated circuit device is an IC card.

8. A thin film integrated circuit device comprising:
   a first display area;
   a thin film integrated circuit including a plurality of semiconductor films as a plurality of active region formed over an insulating film; and a second display area that is formed over the first display area and connected to the thin film integrated circuit, wherein the second display area is a dual emission light-emitting device, and wherein display of the first display area is visible when the second display area is OFF.

9. A thin film integrated circuit device according to claim 8, wherein the first display area is a photograph.

10. A thin film integrated circuit device according to claim 8, wherein the first display area and the second display area are similar in size.

11. A thin film integrated circuit device according to claim 8, wherein the first display area and the second display area are combined whereby displaying letters, graphics, symbols or the combination thereof.

12. A thin film integrated circuit device according to claim 8, wherein the first display area displays a static image.

13. A thin film integrated circuit device according to claim 8, wherein the second display area displays a moving image.

14. A thin film integrated circuit device according to claim 8, wherein the thin film integrated circuit device is an IC card.

15. A thin film integrated circuit device comprising:
a first display area;
a thin film integrated circuit including a plurality of the semiconductor films as a plurality of active region formed over one surface of an insulating film;
a metal oxide provided over another one surface of the insulating film; and
a second display area that is formed over the first display area and connected to the thin film integrated circuit,
wherein the second display area is a dual emission light-emitting device.

16. A thin film integrated circuit device according to claim 15, wherein the first display area is a photograph.

17. A thin film integrated circuit device according to claim 15, wherein the metal film is formed from an element selected from the group consisting of W, Ta, Mo, Nd, Ni, Co, Zr, Zn, Ru, Rh, Pd, Os, and Ir, or an alloy material or a compound material which is based on the element; or an oxide of the metal compound.

18. A thin film integrated circuit device according to claim 15, wherein the metal oxide is $WO_2$ or $WO_3$.

19. A thin film integrated circuit device according to claim 15, wherein the first display area and the second display area are similar in size.

20. A thin film integrated circuit device according to claim 15, wherein the first display area and the second display area are combined whereby displaying letters, graphics, symbols or the combination thereof.

21. A thin film integrated circuit device according to claim 15, wherein the first display area displays a static image.

22. A thin film integrated circuit device according to claim 15, wherein the second display area displays a moving image.

23. A thin film integrated circuit device according to claim 15, wherein the thin film integrated circuit device is an IC card.

24. A thin film integrated circuit device comprising:
a first display area;
a thin film integrated circuit including a plurality of semiconductor films as a plurality of active region formed over one surface of an insulating film;
a metal oxide provided over another surface of the insulating film; and
a second display area that is formed over the first display area and connected to the thin film integrated circuit,
wherein the second display area is a dual emission light-emitting device, and
wherein display of the first display area is visible when the second display area is OFF.

25. A thin film integrated circuit device according to claim 24, wherein the first display area is a photograph.

26. A thin film integrated circuit device according to claim 24, wherein the metal film is formed from an element selected from the group consisting of W, Ti, Ta, Mo, Nd, Ni, Co, Zr, Zn, Ru, Rh, Pd, Os, and Ir, or an alloy material or a compound material which is based on the element; or an oxide of the metal compound.

27. A thin film integrated circuit device according to claim 24, wherein the metal oxide is $WO_2$ or $WO_3$.

28. A thin film integrated circuit device according to claim 24, wherein the first display area and the second display area are similar in size.

29. A thin film integrated circuit device according to claim 24, wherein the first display area and the second display area are combined whereby displaying letters, graphics, symbols or the combination thereof.

30. A thin film integrated circuit device according to claim 24, wherein the first display area displays a static image.

31. A thin film integrated circuit device according to claim 24, wherein the second display area displays a moving image.

32. A thin film integrated circuit device according to claim 24, wherein the thin film integrated circuit device is an IC card.

33. A thin film integrated circuit device comprising:
a first display area;
a thin film integrated circuit having a plurality of thin film transistors formed over one surface of an insulating film;
a metal oxide provided over another one surface of the insulating film; and
a second display area that is formed over the first display area and connected to the thin film integrated circuit,
wherein the second display area is a dual emission light-emitting device.

34. A thin film integrated circuit device according to claim 33, wherein the first display area is a photograph.

35. A thin film integrated circuit device according to claim 33, wherein the metal film is formed from an element selected from the group consisting of W, Ti, Ta, Mo, Nd, Ni, Co, Zr, Zn, Ru, Rh, Pd, Os, and Ir, or an alloy material or a compound material which is based on the element; or an oxide of the metal compound.

36. A thin film integrated circuit device according to claim 33, wherein the metal oxide is $WO_2$ or $WO_3$.

37. A thin film integrated circuit device according to claim 33, wherein the first display area and the second display area are similar in size.

38. A thin film integrated circuit device according to claim 33, wherein the first display area and the second display area are combined whereby displaying letters, graphics, symbols or the combination thereof.

39. A thin film integrated circuit device according to claim 33, wherein the first display area displays a static image.

40. A thin film integrated circuit device according to claim 33, wherein the second display area displays a moving image.

41. A thin film integrated circuit device according to claim 33, wherein the thin film integrated circuit device is an IC card.

42. A thin film integrated circuit device comprising:
a first display area;

a thin film integrated circuit having a plurality of thin film transistors formed over one surface of an insulating film;

a metal oxide provided over another one surface of the insulating film; and a second display area that is formed over the first display area and connected to the thin film integrated circuit, wherein the second display area is a dual emission light-emitting device, and wherein display of the first display area is visible when the second display area is OFF.

43. A thin film integrated circuit device according to claim 42, wherein the first display area is a photograph.

44. A thin film integrated circuit device according to claim 42, wherein the metal film is formed from an element selected from the group consisting of W, Ti, Ta, Mo, Nd, Ni, Co, Zr, Zn, Ru, Rh, Pd, Os, and Ir, or an alloy material or a compound material which is based on the element; or an oxide of the metal compound.

45. A thin film integrated circuit device according to claim 42, wherein the metal oxide is $WO_2$ or $WO_3$.

46. A thin film integrated circuit device according to claim 42, wherein the first display area and the second display area are similar in size.

47. A thin film integrated circuit device according to claim 42, wherein the first display area and the second display area are combined whereby displaying letters, graphics, symbols or the combination thereof.

48. A thin film integrated circuit device according to claim 42, wherein the first display area displays a static image.

49. A thin film integrated circuit device according to claim 42, wherein the second display area displays a moving image.

50. A thin film integrated circuit device according to claim 42, wherein the thin film integrated circuit device is an IC card.

* * * * *